(12) United States Patent
Endo

(10) Patent No.: US 10,914,761 B2
(45) Date of Patent: Feb. 9, 2021

(54) VOLTAGE DETECTOR

(71) Applicant: ABLIC Inc., Chiba (JP)

(72) Inventor: Daiki Endo, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/421,797

(22) Filed: May 24, 2019

(65) Prior Publication Data

US 2019/0361052 A1  Nov. 28, 2019

(30) Foreign Application Priority Data

May 25, 2018 (JP) ................... 2018-100737

(51) Int. Cl.
| | | |
|---|---|---|
| *H03K 5/153* | (2006.01) | |
| *G01R 15/04* | (2006.01) | |
| *G05F 1/56* | (2006.01) | |
| *G01R 19/165* | (2006.01) | |
| *H03K 5/24* | (2006.01) | |

(52) U.S. Cl.
CPC ........... *G01R 15/04* (2013.01); *G01R 19/165* (2013.01); *G05F 1/56* (2013.01); *H03K 5/24* (2013.01)

(58) Field of Classification Search
CPC ................ G01R 15/04; G01R 19/165; G01R 19/16519; G05F 1/56; H03K 5/24; H03K 3/02337
USPC .......................................................... 327/74
See application file for complete search history.

(56) References Cited

U.S. PATENT DOCUMENTS

| | | | | |
|---|---|---|---|---|
| 6,630,858 B1 * | 10/2003 | Takabayashi | ........... | G05F 1/575 327/538 |
| 6,683,481 B1 * | 1/2004 | Zhou | .................... | H03K 17/223 327/143 |
| 7,196,561 B2 * | 3/2007 | Bhattacharya | ....... | H03K 17/223 327/143 |
| 7,348,816 B2 * | 3/2008 | Shin | ..................... | H03K 17/223 327/142 |
| 7,952,400 B2 * | 5/2011 | Abe | ....... | H03K 17/223 327/142 |
| 8,547,144 B2 * | 10/2013 | Lee | ....................... | H03K 17/145 327/142 |
| 8,654,493 B2 * | 2/2014 | Wada | ..................... | H02H 3/207 361/86 |
| 8,797,071 B2 * | 8/2014 | Lee | ........................... | G06F 1/24 327/142 |
| 8,891,270 B2 * | 11/2014 | Song | ..................... | H02M 7/066 363/125 |
| 10,069,491 B2 * | 9/2018 | Song | ........................ | G06F 1/30 |
| 10,707,862 B2 * | 7/2020 | Song | ........................ | G06F 1/30 |
| 2012/0176167 A1 * | 7/2012 | Lee | ........................... | G06F 1/24 327/143 |

FOREIGN PATENT DOCUMENTS

JP          2000-111589 A        4/2000

* cited by examiner

*Primary Examiner* — Ryan Jager

(74) *Attorney, Agent, or Firm* — Brinks Gilson & Lione

(57) ABSTRACT

A voltage detector includes a voltage division circuit which outputs a divided voltage based on an input voltage, a comparison circuit which compares the divided voltage and a reference voltage to output a detection signal and a release signal, and a voltage limiting circuit which limits the divided voltage to a preset voltage.

3 Claims, 4 Drawing Sheets

VOLTAGE DETECTOR

RELATED APPLICATIONS

Priority is claimed on Japanese Patent Application No. 2018-100737, filed on May 25, 2018, the content of which is incorporated herein by reference.

BACKGROUND OF THE INVENTION

1. Field of the Invention

The present invention relates to a voltage detector.

2. Description of the Related Art

FIG. 4 is a circuit diagram illustrating a conventional voltage detector 400 having a hysteresis.

A voltage applied to a monitoring terminal 41 is divided by a voltage division circuit 42, and the divided voltage is applied to an inversion input terminal of a comparator 43. The comparator 43 provides a signal indicative of a result of comparison between the voltage to the inversion input terminal and a reference voltage which is supplied from a reference voltage circuit 44 and is applied to a non-inversion input terminal to an output terminal 47 through an NMOS transistor 45. Further, the signal of the comparator 43 is also applied to a gate of an NMOS transistor 46 which switches a voltage dividing ratio of the voltage division circuit 42.

In case the input voltage of the monitoring terminal 41 is high enough to make the divided voltage higher than the reference voltage, the NMOS transistor 46 turns off since the comparator 43 provides a signal of Lo. This state is called a release state of the voltage detector.

In case the input voltage of the monitoring terminal 41 decreases to make the divided voltage lower than the reference voltage, the NMOS transistor 46 turns on since the comparator 43 provides a signal of Hi. With the turning on of the NMOS transistor 46, the voltage dividing ratio of the voltage division circuit 42 switches to have a lower divided voltage. This state is called a detection state of the voltage detector.

Since the voltage detector 400 constituted as described above has hysteresis by switching the voltage dividing ratio of the voltage division circuit 42 according to the signal of the comparator 43, a stable detection signal can be provided (refer to, for example, FIG. 4 in Japanese Patent Application Laid-Open No. 2000-111589).

SUMMARY OF THE INVENTION

In the conventional voltage detector 400, since the voltage exceeding the reference voltage is always applied to the inversion input terminal of the comparator 43 as long as the voltage detector 400 is in the release state, the characteristic of a transistor constituting the inversion input terminal degrades. The voltage detector therefore has a possibility that the detection voltage and the release voltage gradually change to degrade its performance in the long term.

The present invention provides a voltage detector capable of enhancing long-term reliability.

A voltage detector according to an embodiment of the present invention includes a voltage division circuit which outputs a divided voltage based on an input voltage, a comparison circuit which compares the divided voltage and a reference voltage to output a detection signal and a release signal, and a voltage limiting circuit which limits the divided voltage to a preset voltage.

According to a voltage detector of the present invention, since a divided voltage is limited by an NMOS transistor receiving a constant voltage at its gate even if the voltage of a monitoring terminal greatly exceeds a release voltage, the characteristic of a transistor constituting an inversion input terminal of a comparator can be prevented from degrading, and hence long-term degradation of performance can be suppressed.

DETAILED DESCRIPTION OF THE PREFERRED EMBODIMENTS

Embodiments of the present invention will hereinafter be described with reference to the accompanying drawings.

Figure 1:
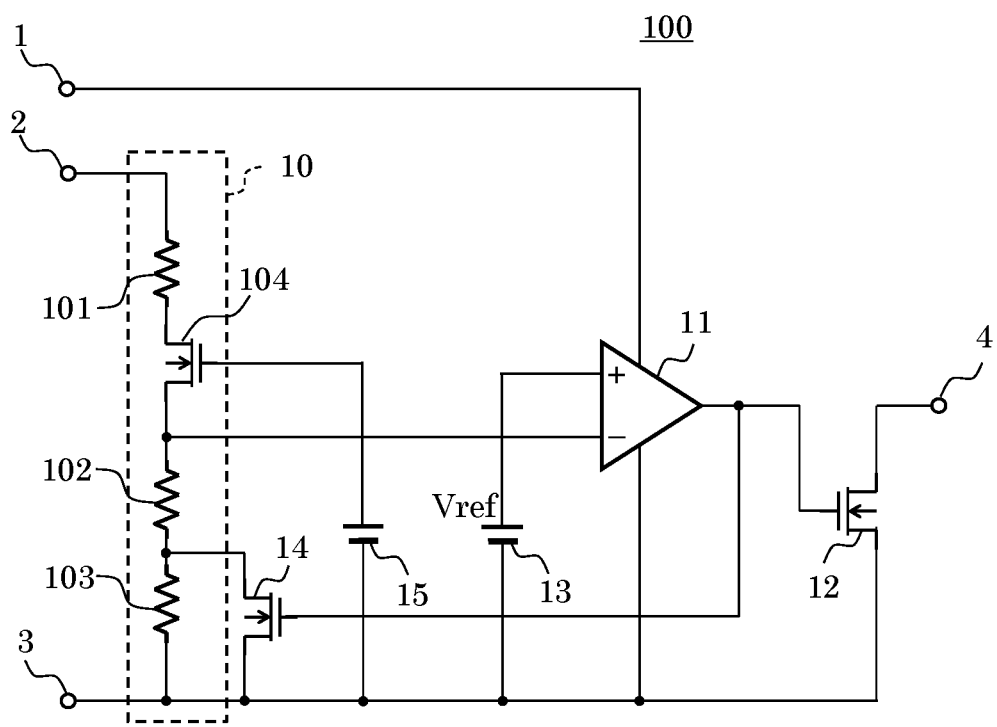
FIG. 1 is a circuit diagram illustrating an example of a voltage detector according to an embodiment of the present invention.

FIG. 1 is a circuit diagram illustrating an example of a voltage detector according to an embodiment of the present invention.

The voltage detector 100 according to the embodiment includes a voltage division circuit 10, a comparator 11, an output transistor 12, a reference voltage circuit 13, an NMOS transistor 14, and a constant voltage circuit 15. The voltage division circuit 10 has a resistor 101, an NMOS transistor 104, a resistor 102, and a resistor 103 connected in series between a monitoring terminal 2 and a ground terminal 3.

The comparator 11 has an inversion input terminal to which a source of the NMOS transistor 104 is connected, a non-inversion input terminal to which the reference voltage circuit 13 is connected, and an output terminal connected to a gate of the output transistor 12 and a gate of the NMOS transistor 14. The NMOS transistor 14 has a drain and source connected across the resistor 103. The NMOS transistor 104 has a gate to which the constant voltage circuit 15 is connected.

A description will next be made as to the operation of the voltage detector 100 according to the embodiment.

Since the output of the comparator 11 is Lo in a release state in which a divided voltage provided from the voltage division circuit 10 is higher than a reference voltage of the reference voltage circuit 13, the NMOS transistor 14 turns off. The output of the voltage division circuit 10 is a voltage divided by the resistor 101 and the resistors 102 and 103 connected in series. The divided voltage increases with a rise in a voltage applied to the monitoring terminal 2.

Here, since an NMOS transistor can't feed a current at a gate-source voltage lower than the threshold voltage of the NMOS transistor, the gate-source voltage of the NMOS transistor 104 is limited to a voltage which becomes equal to the threshold voltage of the NMOS transistor 104. Assuming that the threshold voltage of the NMOS transistor 104 is VTN, and the voltage provided from the constant voltage circuit 15 is VFIX, a source voltage of the NMOS transistor 104 is limited to a preset value expressed by VFIX−VTN. That is, the constant voltage circuit 15 and the NMOS transistor 104 operate as a voltage limiting circuit to limit the divided voltage. The divided voltage provided from the voltage division circuit 10 is therefore limited to the preset value expressed by VFIX−VTN even if a high voltage is applied to the monitoring terminal 2.

For this reason, even if the voltage applied to the monitoring terminal 2 greatly exceeds the release voltage of the voltage detector, the divided voltage provided from the voltage division circuit 10 is limited by the NMOS transistor 104 and thus will not degrade the characteristic of the transistor which constitutes each input terminal of the comparator 11.

Incidentally, in the limitation of the divided voltage, since the divided voltage is set higher than the reference voltage, no effect is given to the detection and release operations of the voltage detector.

As described above, since the voltage detector 100 according to the embodiment includes the NMOS transistor 104 for limiting the divided voltage provided from the voltage division circuit 10, it is capable of maintaining the accuracy of the detection voltage and the release voltage.

Figure 2:
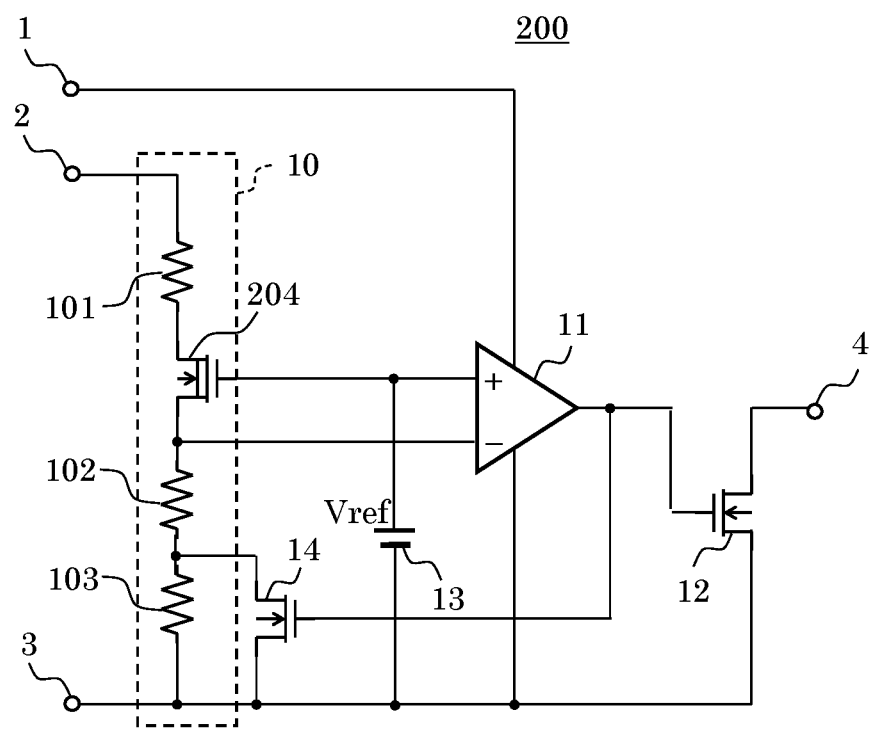
FIG. 2 is a circuit diagram illustrating another example of the voltage detector according to the embodiment of the present invention.

FIG. 2 is a circuit diagram illustrating another example of the voltage detector according to the embodiment.

The voltage detector 200 has a configuration in which in terms of the voltage detector 100 illustrated in FIG. 1, the NMOS transistor 104 of the voltage division circuit 10 is replaced by a depletion type NMOS transistor 204 having a gate to which a reference voltage is applied. In other constituents, the same circuits as those in the voltage detector 100 are denoted by the same reference numerals, and their detailed description will be omitted.

Assuming that a threshold voltage of the depletion type NMOS transistor 204 is VTND, and a reference voltage of a reference voltage circuit 13 is VREF, a divided voltage of a voltage division circuit 10 is limited to a value represented by VREF−VTND. Since the threshold voltage of the depletion type NMOS transistor is a negative value, the voltage VREF−VTND always becomes larger than the reference voltage VREF. The voltage detector 200 is therefore capable of limiting the divided voltage to a desired voltage by appropriately setting the threshold voltage VTND without including the constant voltage circuit 15.

Figure 3:
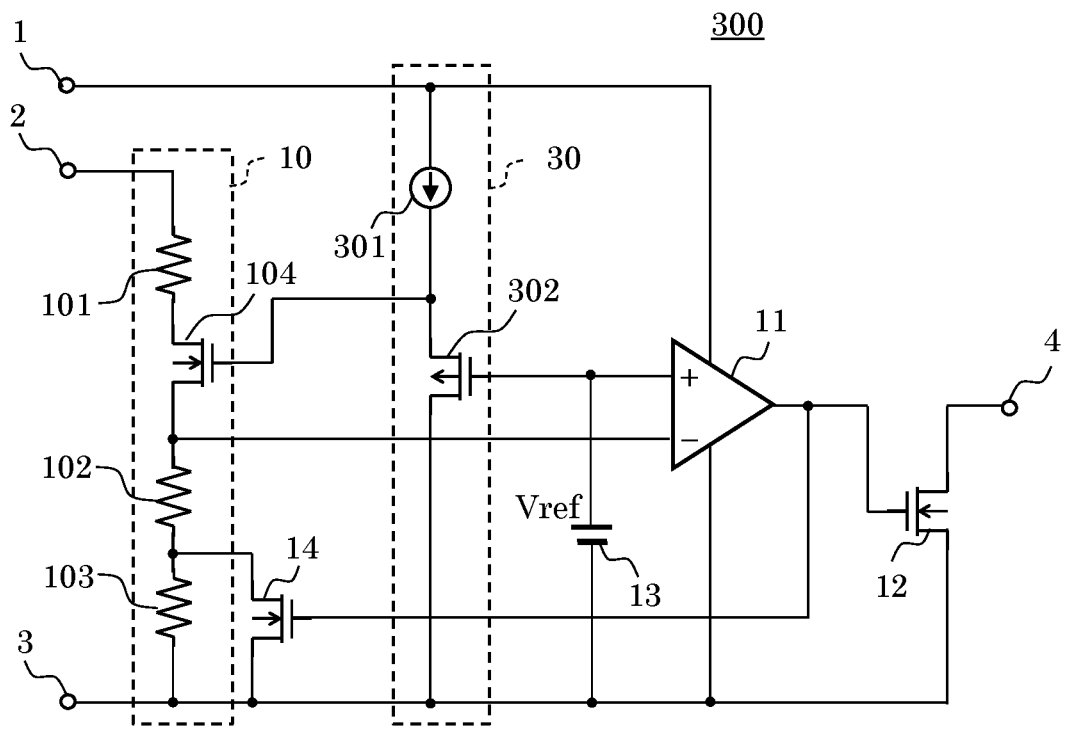
FIG. 3 is a circuit diagram illustrating a further example of the voltage detector according to the embodiment of the present invention.
Figure 4:
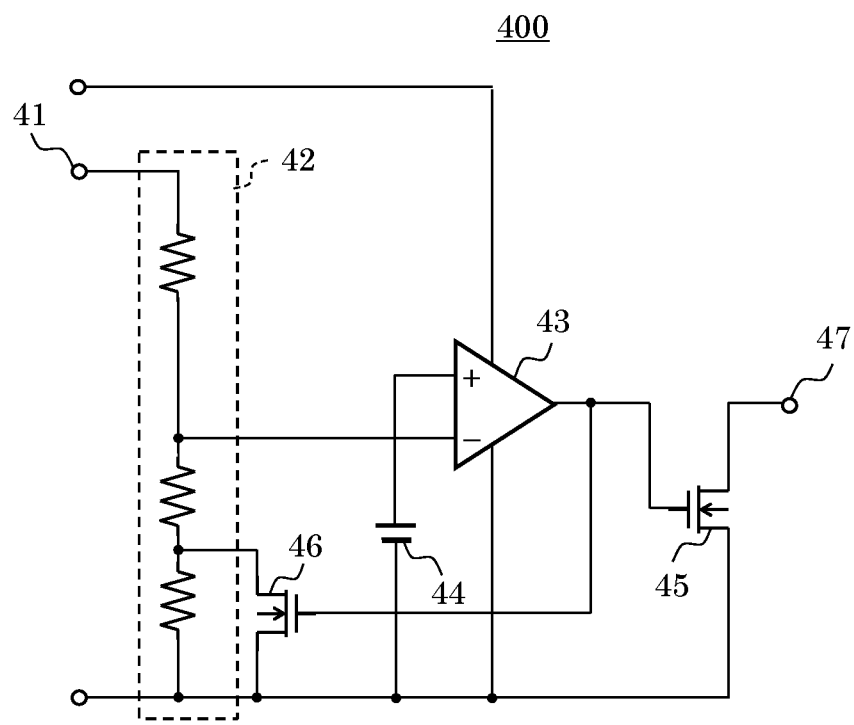
FIG. 4 is a circuit diagram illustrating a voltage detector in Related Art.

FIG. 3 is a circuit diagram illustrating yet another example of the voltage detector according to the embodiment.

The voltage detector 300 has a configuration in which in terms of the voltage detector 100 illustrated in FIG. 1, the constant voltage circuit 15 is replaced by a voltage adjustment circuit 30 including a current source 301 and a PMOS transistor 302. In other constituents, the same circuits as those in the voltage detector 100 are denoted by the same reference numerals, and their detailed description will be omitted.

The current source 301 has one terminal connected to a power supply terminal 1 and the other terminal connected to a source of the PMOS transistor 302. The PMOS transistor 302 has a source connected to a gate of an NMOS transistor 104, a gate to which a reference voltage circuit 13 is connected, and a drain connected to a ground terminal 3.

The current source 301 and the PMOS transistor 302 form a source follower. A divided voltage is therefore limited to VREF+VTP−VTN assuming that a threshold voltage of the NMOS transistor 104 is VTN, a threshold voltage of the PMOS transistor 302 is VTP, and a reference voltage is VREF.

The voltage detector 300 according to the yet another example of the embodiment is therefore capable of limiting the divided voltage to a desired voltage and easily adjusting the same by the threshold voltage VTP of the PMOS transistor 302.

Although the embodiments of the present invention have been described above, the present invention is not limited to the above embodiments. It is needless to say that various changes can be made thereto within the scope not departing from the gist of the present invention.

For example, a voltage detector which has a monitoring terminal 2 in common with a power supply terminal 1 is also capable of obtaining a similar effect. Also, for example, a voltage detector in which a voltage dividing ratio of a voltage division circuit 10 is not switched by an NMOS transistor 14 is also capable of obtaining a similar effect.

Incidentally, in the conventional voltage detector 400, upon the power supply voltage being supplied in the state in which the intermediate voltage between the detection voltage and the release voltage is applied to the monitoring terminal 41, the comparator 43 outputs the release signal because the divided voltage of the voltage division circuit 42 is applied to the inversion input terminal. In the voltage detectors 100 through 300 of the present invention, on the other hand, since the voltage division circuits 10 respectively include the NMOS transistor 104 or the NMOS transistor 204, the divided voltage is increased more gently than the reference voltage Vref, and hence the comparator 11 can output the detection signal, even in the above-described situation. That is, according to the voltage detectors 100 through 300 of the present invention, there is also an effect that no restriction is imposed on the order of applying the voltages to the power supply terminal 1 and the monitoring terminal 2.

What is claimed is:

1. A voltage detector, comprising:
   a voltage division circuit configured to output a divided voltage based on an input voltage;
   a comparison circuit configured to compare the divided voltage and a reference voltage to output one of a detection signal and a release signal; and
   a voltage limiting circuit configured to limit the divided voltage to a preset voltage,
   wherein the voltage division circuit comprises:
      an NMOS transistor having a source to which an output terminal of the voltage division circuit is connected, and a gate to which a constant voltage is applied,
      a first resistor connected between a first terminal to which the input voltage is applied, and a drain of the NMOS transistor, and
      a second resistor connected between the output terminal of the voltage division circuit and a second terminal to which a reference potential is applied.

2. The voltage detector according to claim 1,
   wherein the NMOS transistor is a depletion type, and
   wherein the constant voltage is the reference voltage.

3. The voltage detector according to claim 1, wherein the constant voltage is supplied from a voltage adjustment circuit to which the reference voltage is entered.

* * * * *